(12) United States Patent
Creek

(10) Patent No.: US 6,211,723 B1
(45) Date of Patent: Apr. 3, 2001

(54) PROGRAMMABLE LOAD CIRCUIT FOR USE IN AUTOMATIC TEST EQUIPMENT

(75) Inventor: William R. Creek, Fremont, CA (US)

(73) Assignee: LTX Corporation, Westwood, MA (US)

( * ) Notice: Subject to any disclaimer, the term of this patent is extended or adjusted under 35 U.S.C. 154(b) by 0 days.

(21) Appl. No.: 09/235,056

(22) Filed: Jan. 20, 1999

(51) Int. Cl.$^7$ .................................................. H02M 7/162
(52) U.S. Cl. .................................. 327/494; 327/587
(58) Field of Search .......................... 327/84, 92, 429, 327/494, 497, 90, 94, 97, 587

(56) References Cited

U.S. PATENT DOCUMENTS

| | | | |
|---|---|---|---|
| 4,937,472 | * | 6/1990 | Martin et al. ............................ 327/92 |
| 5,572,154 | * | 11/1996 | Rakers et al. ........................... 327/92 |

* cited by examiner

Primary Examiner—Toan Tran
Assistant Examiner—Hiep Nguyen
(74) Attorney, Agent, or Firm—Blakely, Sokoloff, Taylor & Zafman LLP

(57) ABSTRACT

A programmable load circuit operable to generate a plurality of test signals is described. The programmable load circuit comprises a diode bridge coupled between an input and an output. The diode bridge compares the voltage on the input to the voltage on the output. The programmable load circuit also comprises a plurality of current sources. A first set of the plurality of current sources are coupled to intermediate nodes of the diode bridge. Additionally, the programmable load circuit comprises a switching circuit coupled between the intermediate nodes of the diode bridge and a second set of the plurality of current sources. Furthermore, the programmable load circuit also comprises a load regulator coupled to the output and the intermediate nodes of the diode bridge. The load regulator is configured to reduce leakage current on the output.

22 Claims, 6 Drawing Sheets

PROGRAMMABLE LOAD CIRCUIT FOR USE IN AUTOMATIC TEST EQUIPMENT

FIELD OF THE INVENTION

The present invention relates to an automatic tester. More particularly, the present invention relates to an automatic tester with a programmable load circuit that generates a source or sink current to test the output pins of a device under test.

BACKGROUND

Test equipment is typically used to determine whether a device under test ("DUT") follows a set of timing and drive strength specifications. Accordingly, testing accuracy plays a vital role in the design of test equipment because a discrepancy in measurements can result in an incorrect classification of a DUT. For example, in some testing environments, provided a DUT follows a set of predetermined specifications, the DUT is categorized as a valid device for sale. Typically, to pass as a valid device each pin of a given DUT must satisfy both timing and drive strength requirements. Typical timing requirements include valid time, hold time, and setup time. Typical drive strength requirements include driving an output to a predetermined voltage despite an opposing current source load.

Prior art testers use a diode bridge system to determine the drive strength of a DUT output. The diode bridge allows a tester to determine the high-state drive capability of a DUT by sinking current out of the DUT when the DUT is driving an output pin to a high voltage. Alternatively, the diode bridge allows a tester to determine the low-state drive capability of a DUT by sourcing current into the DUT when the DUT is driving an output pin to a low voltage.

FIG. 1 illustrates a prior art testing system. In particular, test system 100 is used to determine the drive strength of a DUT pin coupled to output Vd 130. To test the drive strength of the DUT pin, system 100 compares the voltage on input voltage switch ("Vs") 110 to the voltage on output Vd 130 via the diode bridge consisting of Schottky diodes D1, D2, D3, and D4—the diodes are typically forward biased during a 0.5 voltage drop. If the voltage on Vd 130 is greater than the voltage on Vs 110, system 100 sinks current away from the DUT via current source ("Is") 125. Thus, testing the drive strength of the DUT when the DUT is driving an output pin to a high voltage. On the other hand, if the voltage on Vd 130 is less than the voltage on Vs 110, system 100 injects current into the DUT via current source ("Is") 120. Thus, testing the drive strength of the DUT when the DUT is driving an output pin to a low voltage.

During the testing of a DUT pin coupled to output Vd 130, system 100 sets Vs 110 to the switch point voltage of the DUT and closes both switches S121 and S126. As illustrated in FIG. 1, Vs 110 is coupled to buffer 115 which, in turn, is coupled to an intermediate node (N112) of the diode bridge. Typically, buffer 115 is a unity buffer that transfers the voltage on Vs 110 to node N112. Thus, Vs 110 is compared to Vd 130 via the intermediate nodes of the diode bridge. In particular, as the voltage on Vd 130 increases past Vs 110, diodes D4 and D1 are forward biased while diodes D3 and D1 are reverse biased. Thus, Is 125 sinks current out of Vd 130. Alternatively, as the voltage on Vd 130 decreases below Vs 110, diodes D3 and D2 are forward biased while diodes D4 and D1 are reverse biased. Thus, Is 120 injects current into Vd 130.

System 100 allows prior art testers to accurately test the drive strength of slow speed devices. Prior art testers, however, create numerous disadvantages during the testing of high speed or low power devices. For example, one disadvantage of system 100 is evident during the testing of low power devices. In particular, during power measurements of a low power DUT coupled to node Vd 130, the leakage in the Schottky diodes (D1–D4) results in a data offset of the power supply current measurement. Thus, system 100 incorrectly classifies low power devices as having a high direct current ("DC") leakage.

Another disadvantage of prior art testers results form the inconsistent loading characteristics of system 100. Specifically, if Vd 130 is coupled to an input/output ("I/O") pin of a DUT, system 100 operates in two different modes. If the I/O pin is operating as an input, system 100 switches S121 and S126 to an off position. If the I/O pin is operating as an output, however, system 100 switches S121 and S126 to an on position. The transition between the two modes results in nodes N113 and N111 floating to an undetermined value, thus resulting in a timing error during the testing of high speed devices.

For example, Vd 130 is coupled to an I/O pin of a DUT with a 0 to 5 voltage swing. System 100 sets Vs to 2.5 volts. As previously described, during the input testing of the DUT, system 100 moves switches S121 and S126 to an off position. Thus, resulting in node N113 floating to a voltage value between 2 and 5 volts. Subsequently, during the drive strength testing of node Vd 130, system 100 moves switches S121 and S126 to an on position. During the initial low-to-high transition of the DUT output, D4 turns on and the capacitive loading of node N113 is transferred to node Vd 130. However, on a subsequent low-to-high transition of the DUT output, D4 remains off because node N113 was previously driven to a high stage, thus the capacitive loading of node N113 is not transferred to node Vd 130. The inconsistent transfer of capacitive loading results in a timing error.

FIG. 1 also illustrates the timing errors created by the inconsistent transfer of capacitive loading by system 100. In particular chart 105 outlines the voltage transitions of output Vd 130 during the two different modes of system 100. The horizontal axis of timing chart 105 shows time ("t"). The vertical axis of timing chart 015 shows the voltage level on output Vd 130.

Prior to time period 106, the DUT pin coupled to output Vd 130 is used as an input. Accordingly, system 100 moves switches S121 and S126 to the off position. Subsequently, system 100 is used to determine the drive strength of the DUT pin coupled to Vd 130. Accordingly, system 100 moves switches S121 and S126 to the off position. As previously described, the initial low-to-high transition of output Vd 130 incurs additional capacitive loading. Thus, as illustrated in timing chart 105, voltage rise time 150 is slower than voltage rise time 155. In prior art slow speed devices the difference in rise times is considered negligible. In high speed devices, however, the tester generated difference in rise time may lead to an incorrect characterization of a high speed device as an invalid device.

Yet another disadvantage of prior art testers results from using system 100 as a low voltage driver. FIG. 2 illustrates a prior art low voltage driver used to drive wave forms on a DUT input coupled to output Vd 230. System 200 includes input Vtest 255 coupled to driver 220 which, in turn, is coupled to resistor (R215). R215 is also coupled to load 210 (corresponding to system 100) and output VD 230. Typically, driver 220 is a unity buffer that transfers the value on input Vtest 255 to node N211. System 200 creates voltage swings on output Vd 230 by controlling the values of input Vtest 225, R215, and the switching times of S121 and S126.

For example, to generate a low voltage output on a DUT input. System 200 sets Vtest 225 to 50 milli-volts ("mV"), R 215 to 50 ohms, and VS 110 to −2 volts—thus ensuring that system 100 only performs a current sink. System 200 also sets both Is 120 and Is 125 to 2 milli-amperes ("mA"). As system 200, moves switches S121 and S126 between the on and off position, either 2 mA of current is sunk out off Vd 230 or Vd 230 is left floating. Thus, resulting in an output on VD 230 that transitions between −0.05 volts an 0.05 volts.

As previously described, the switching of S121 and S126 creates inconsistent transfer of capacitive loading by system 100. The low voltage driver of system 200, however, requires the switching of S121 and S126 to create a wave form on output Vd 130. Accordingly, the inconsistent transfer of capacitive loading by system 100 results in inconsistent wave forms on output Vd 230. Furthermore, system 100 creates an over shoot of sunk current. Thus, creating further inconsistencies in the wave forms generated on output Vd 230. In prior art testing of slow speed devices, the inconsistent wave forms generated on output Vd 230 are considered negligible. In high speed devices, however, the inconsistent wave forms generated on output Vd 230 may lead to an incorrect characterization of a high speed device as an invalid device.

SUMMARY OF THE INVENTION

A programmable load circuit operable to generate a plurality of test signals is disclosed. The programmable load circuit comprises a diode bridge coupled between an input and an output. The diode bridge compares the voltage on the input to a voltage on the output. The programmable load circuit also comprises a plurality of current sources. A first set of the plurality of current sources are coupled to intermediate nodes of the diode bridge. Additionally, the programmable load circuit comprises a switching circuit coupled between the intermediate nodes of the diode bridge and a second set of the plurality of current sources. Furthermore, the programmable load circuit comprises a load regulator coupled to the output and the intermediate nodes of the diode bridge. The load regulator is configured to reduce leakage current on the output.

Other objects, features and advantages of the present invention will be apparent from the accompanying drawings and from the detailed description that follows.

BRIEF DESCRIPTION OF THE DRAWINGS

The features and advantages of the present invention are illustrated by way of example and not limitation in the figures of the accompanying drawings in which like references indicate similar elements and in which.

DETAILED DESCRIPTION

A test circuit comprising a programmable load circuit with multiple operational modes is disclosed. The test circuit provides a high accuracy testing system that determines the drive strength of a device under test ("DUT") output. The test circuit also provides a high accuracy testing system that allows the generation of low voltage wave forms on a DUT input. For one embodiment, devices examined by the test circuit include integrated circuits used in telecommunication applications. For an alternative embodiment, devices examined by the test circuit include high speed microprocessors. For other embodiments, other types of integrated circuits are examined by the test circuit.

An intended advantage of an embodiment of the invention is to provide a test circuit that provides accurate power testing of a DUT. The test circuit includes a programmable load circuit with reduced leakage current. Thus, allowing coupling of the test circuit to the DUT without offsetting the power measurements of the DUT.

Another intended advantage of an embodiment of the invention is to provide a programmable load circuit that does not transfer parasitic capacitance. In particular, a programmable load circuit that generates a stable load between different testing modes is disclosed. The input testing of an I/O pin followed by a drive strength characterization of the I/O pin leads to a variable loading on the I/O. Thus, possibly resulting in an inaccurate classification of the drive strength characteristics of the DUT driving the I/O pin.

Yet another intended advantage of an embodiment of the invention is to provide a programmable load circuit that exercise the input pin of a DUT by generating a low voltage wave form. In particular, a programmable load circuit that generates a consistent wave form by controlling the intermediate nodes of the programmable load circuit is disclosed.

Figure 1:
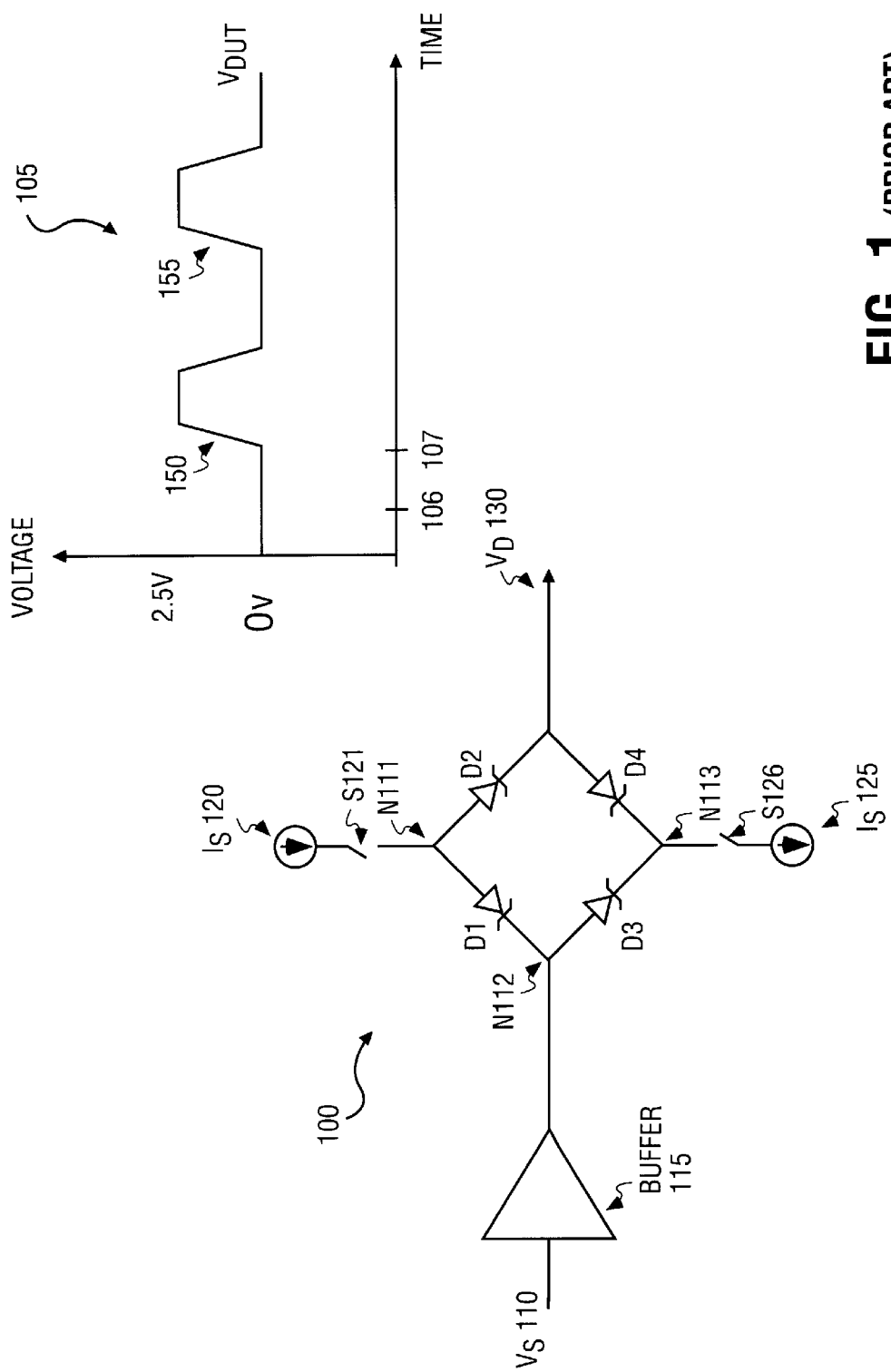
FIG. 1 illustrates a prior art drive strength testing circuit and a timing chart of voltage transitions generated by an inconsistent capacitive transfer of the prior art testing system.
Figure 2:
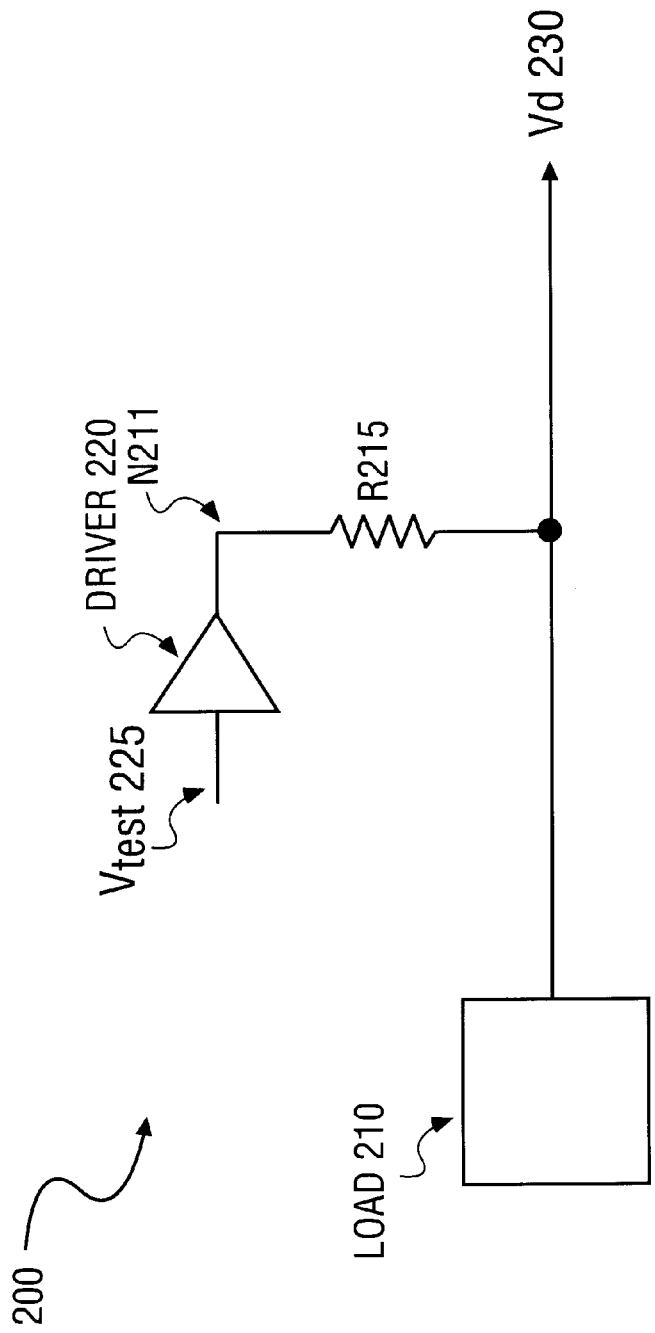
FIG. 2 illustrates a prior art low voltage driver using the prior art drive strength testing circuit of FIG. 1 used.
Figure 3:
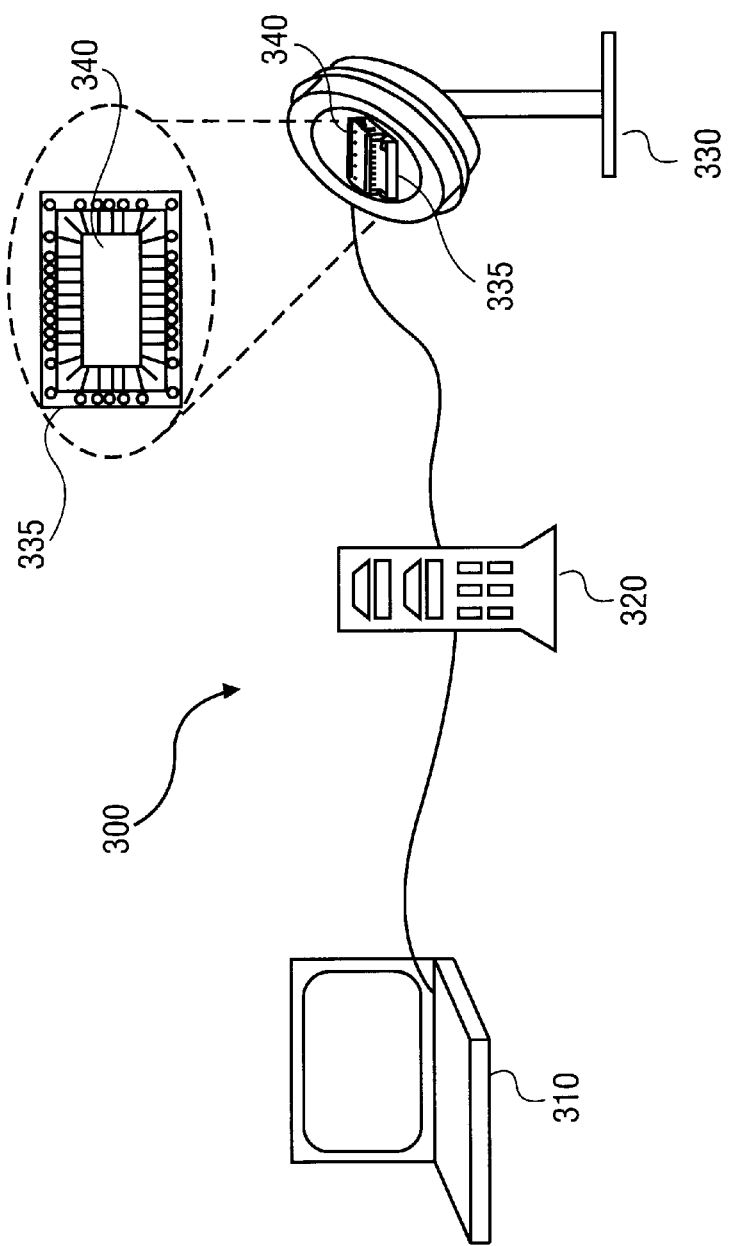
FIG. 3 shows one embodiment of a test circuit system.

FIG. 3 shows one embodiment of a test circuit system. In particular, test system 300 shows computer 310 coupled to diagnostic system 320. Diagnostic system 320, in turn, is coupled to testing base 330. Testing base 330 is used to orient and couple the pins of device under test ("DUT") 340 to interface circuit 335. As illustrated in FIG. 3, testing base 330 provides a platform that allows interface circuit 335 to directly connect to the pins of DUT 340. For one embodiment, interface circuit 335 includes three components. The first component includes drive circuits (not shown) used to drive the input pins of DUT 340. The second component includes comparators (not shown) used to read the output pins of DUT 340. The third component includes programmable loads (not shown) used to determine the drive strength of the output pins of DUT 340. Using interface circuit 330, test system 300 determines the input/output ("I/O") characteristics of DUT 340.

For one embodiment, computer 310 generates test vectors. The test vectors include a set of inputs used to exercise the logic included in DUT 340. The test vectors also include a set of expected outputs. The excepted outputs represent a desired output based on selected input values. Using the test vectors, test system 300 examines the I/O characteristics of DUT 340. In particular, diagnostic system 320 calibrates the input test vectors, via interface circuit 335, and applies the calibrated input signals to the input pins of DUT 340. Diagnostic system 320 also reads the output pins of DUT 340 via interface circuit 335. Subsequent to reading the DUT's output values, diagnostic system 320 compares the values on the output pins to the excepted vector outputs.

For a given set of inputs, system 300 compares the values generated by DUT 340 versus the expected outputs during a given time period. Accordingly, system 300 determines the timing and drive strength specifications of DUT 340 pins. For one embodiment, DUT 340 comprises a digital microprocessor. For an alternative embodiment, DUT 340 comprises a mixed signal communication integrated circuit.

For one embodiment, test system 300 is used to determine the drive strength of a DUT. Accordingly, interface circuit 335 includes a programmable load circuit that injects current into the DUT or sinks current from the DUT. Each pin of the DUT is coupled to programmable load circuit. Using the programmable load circuit, test system 300 exercises the drive strength of the DUT pins. For yet another embodiment, the programmable load circuit is used to generate a low voltage swing input on a single input of the DUT.

Figure 4:
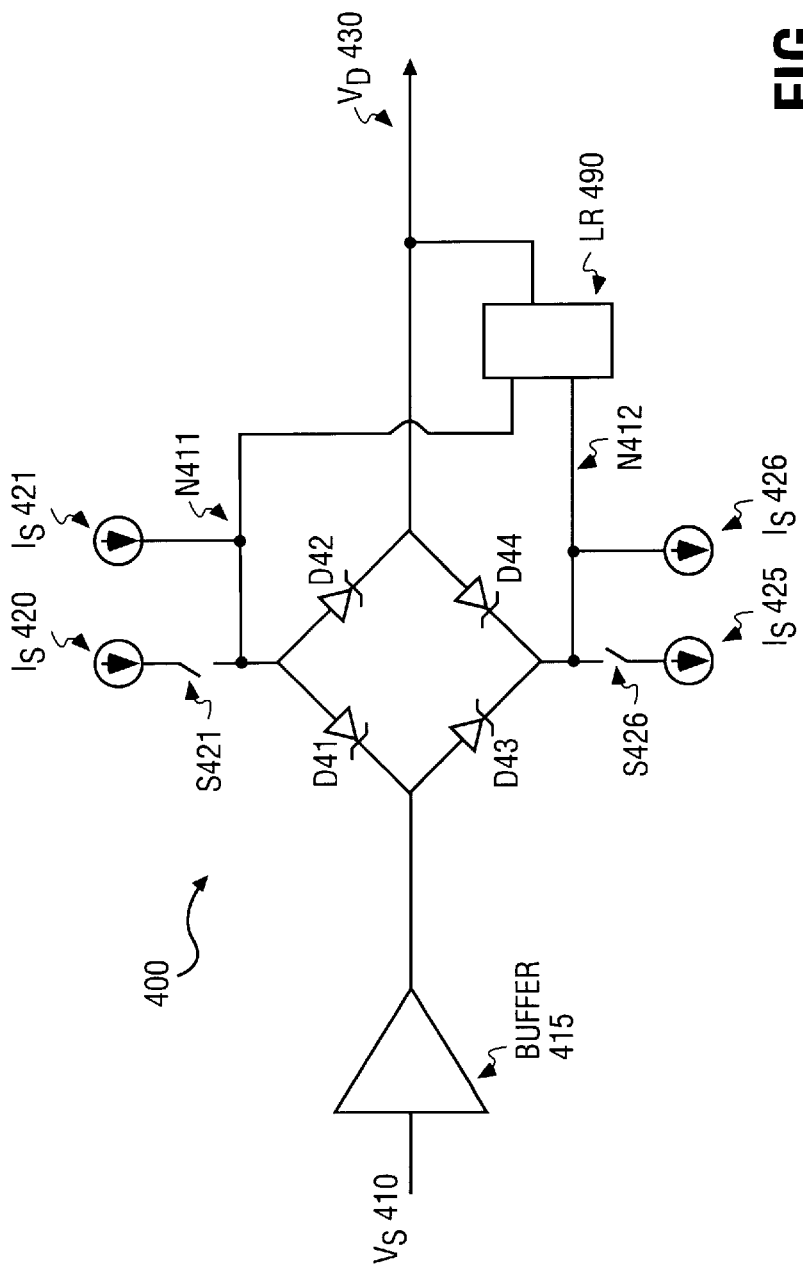
FIG. 4 shows one embodiment of a programmable load circuit.

FIG. 4 shows one embodiment of a programmable load circuit. In particular, system 400 is used to determine the drive strength of a DUT pin coupled to output Vd 430. To test the drive strength of the DUT pin, system 400 compares the voltage on input voltage switch ("Vs") 410 to the voltage on output Vd 430 via the diode bridge consisting of diodes D41, D42, D43, and D44. For one embodiment, diodes D41, D42, D43, and D44 are Schottky diodes. For an alternative embodiment, diodes D41, D42, D43, and D44 are forward biased during a 0.5 voltage drop. If the voltage on Vd 430 is greater than the voltage on Vs 410, system 400 sinks current away from the DUT via current source ("Is") 425 and Is 426. Thus, testing the drive strength of the DUT when the DUT is driving an output pin to a high voltage. Alternatively, if the voltage on Vd 430 is less than the voltage on Vs 410, system 400 injects current into the DUT via current source Is 420 and Is 421. Thus, testing the drive strength of the DUT when the DUT is driving an output pin to a low voltage.

For one embodiment, during drive strength testing of a DUT pin coupled to output Vd 430, system 400 sets Vs 410 to the switch point voltage of the DUT and closes both switches S421 and S426. As illustrated in FIG. 4, Vs 410 is coupled to buffer 415 which, in turn, is coupled to an intermediate node (N412) of the diode bridge. For one embodiment, buffer 415 is a unity buffer that transfers the voltage on Vs 410 to node N412. Thus, Vs 410 is compared to Vd 430 via the intermediate nodes of the diode bridge. In particular, as the voltage on Vd 430 increases past Vs 410, diodes D44 and D41 are forward biased while diodes D43 and D41 are reverse biased. Thus, system 400 test the high voltage drive strength of a DUT coupled to VD 430 by sinking current from Vd 430 via Is 425 and Is 426. Alternatively, as the voltage on Vd 430 decreases below Vs 410, diodes D43 and D42 are forward biased while diodes D44 and D41 are reverse biased. Thus, system 400 test the low voltage drive strength of a DUT coupled to VD 430 by injecting current into Vd 430 via Is 420 and Is 421.

For an alternative embodiment, during the testing of an input coupled to VD 430, system 400 opens both switches S421 and S426. The transition of switches S421 and S426 from a closed position to an open position results in system 400 incurring leakage current. Additionally, as previously described, returning switches S421 and S426 back to a closed position results in the transfer of parasitic capacitance because nodes N411 and N412 transition to an indeterminate state when switches S421 and S426 are open. To reduce the leakage current and hold nodes N411 and N412 to a known voltage, system 400 also includes a load regulator (LR 490).

As illustrated in FIG. 4, LR 490 is coupled to output Vd 430, node N411, and node N412. LR 490 ensures that nodes N411 and N412 track the voltage on Vd 430 while switches S421 and S426 are in the open position. For one embodiment, a DUT pin is coupled to output Vd 430. LR 490 ensures that nodes N411 and N412 track the voltage on the DUT pin while switches S421 and S426 are in the open position. Thus, the switching of S421 and S426 does not transfer any parasitic capacitance because D42 and D44 are kept off (i.e. reverse biased) while switches S421 and S426 are in the open position. For one embodiment, a DUT pin coupled to VD 430 produces signal transitions exceeding 2.5 volts per nano-second. The fast transitions result in the forward biasing of D42 and D44 for a short period of time during the rising and falling edges of the signal. The short forward biasing period, however, appears constantly and results in an accountable parasitic transfer.

For an alternative embodiment, diodes D44 and D42 are matched in size and physical lay out. By controlling the voltage on nodes N411 and N412, LR 490 ensures that both diodes D44 and D42 are reverse biased by the same voltage. Thus, the leakage current from diodes D44 and D42 will cancel at output Vd 430. Accordingly, the power measurement of a DUT coupled to output Vd 430 is not affected by the leakage current of system 400. For another embodiment, LR 490 controls the voltage on nodes N411 and N412 without using the energy (i.e. voltage or current) available on output Vd 430. Thus, the power measurement of a DUT coupled to output Vd 430 is not affected by system 400.

Figure 5:
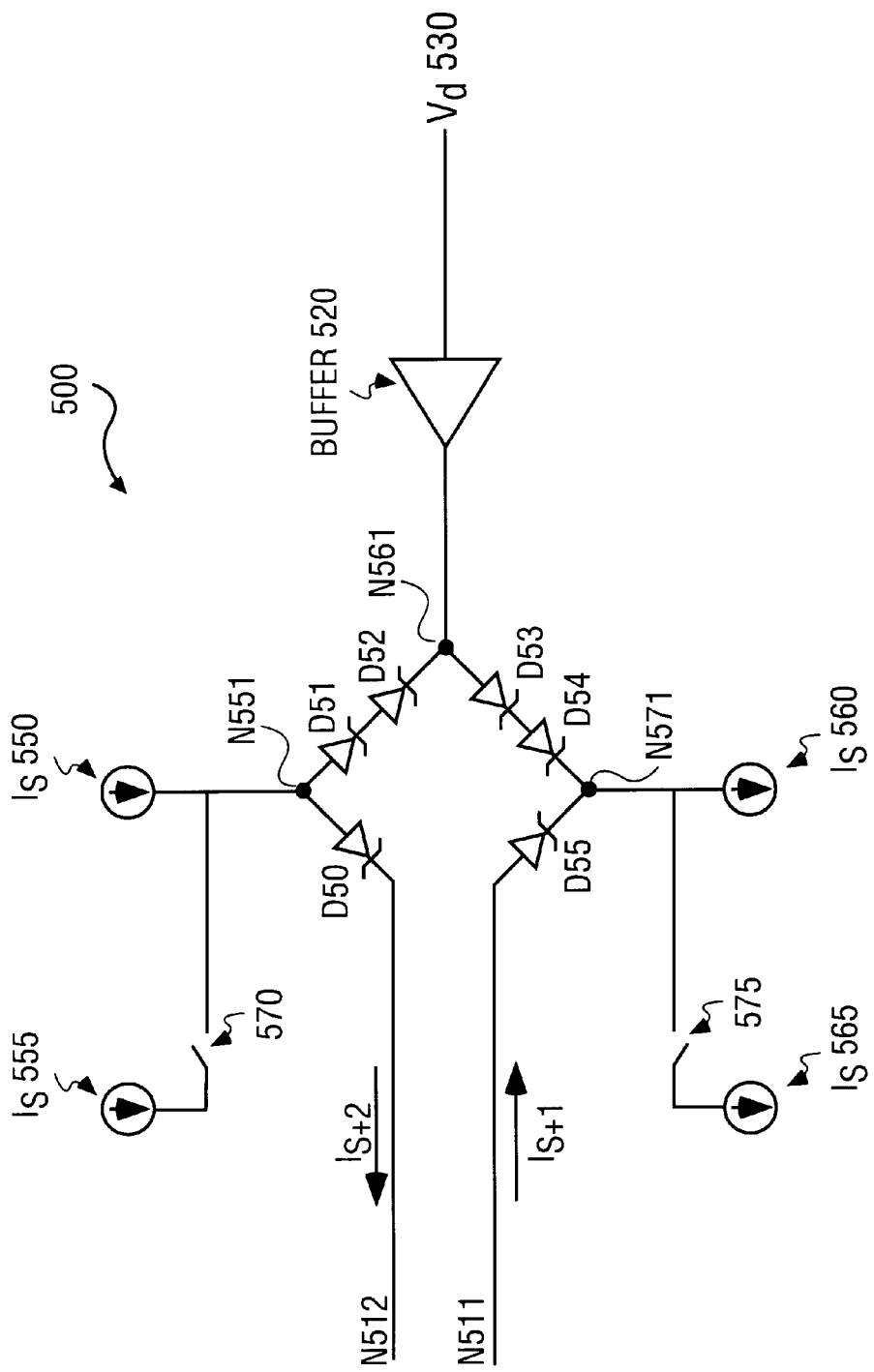
FIG. 5 shows one embodiment of a load regulator.

FIG. 5 shows one embodiment of a load regulator. In particular, LR 500 includes inputs Vd 530, N511, and N512. LR 500 also includes four current sources (Is 550, Is 555, Is 560, and Is 565) and three intermediate nodes (N551, N561, and N571). Is 550 is coupled to N551 and Is 555 is selectively coupled to N551 via switch 570. Similarly, Is 560 is coupled to N571 and Is 565 is selectively coupled to N571 via switch 575.

As illustrated in FIG. 5, the three intermediate nodes form a semi-diode bridge. In particular, diodes D51 and D52 are coupled between nodes N551 and N561. Similarly, diodes D53 and D54 are coupled between nodes N561 and N571. The last two diodes D50 and D55 are coupled to inputs N512 and N511, respectively. Diodes D50 and D55 are also coupled to nodes N551 and N571, respectively. For one embodiment, diodes D50–D55 are Schottky diodes. For an alternative embodiment, diodes D50–D55 are forward biased during a 0.5 voltage drop.

LR 500 also includes a buffer 520 coupled between Vd 530 and N561. For one embodiment, buffer 520 is a unity buffer that transfers the voltage on Vd 530 to N561 while ensuring that the energy on Vd 530 is not affected by voltage transitions of LR 500. Thus, LR 500 does not affect the power measurement of a DUT couple to VD 530.

For another embodiment, LR 500 corresponds to LR 490 of the programmable load circuit (system 400) described in conjunction with FIG. 4. Thus, Vd 530 is coupled to Vd 430. Additionally, nodes N511 and N512 are coupled to nodes N411 and N412, respectively.

As previously described, during the testing of an input coupled to VD 430, system 400 opens both switches S421 and S426. LR 500, however, closes both switches 570 and 575 during the testing of an input coupled to Vd 430 (Vd 530). For example, for one embodiment, during the testing of a DUT input coupled to Vd 430 a net current supply of Ist1

Ist1=Is 421−[Is 560+Is 565]

exits node N411. During input testing on output Vd 430 switch S421 is open, thus Ist1 is supplied by buffer 520. For one embodiment, buffer 520 is a unity buffer and diodes D50–D55 are forward biased during a 0.5 voltage drop Thus, N561 is equal to the DUT voltage, N571 is one volt below the DUT voltage, and N411 is clamped at 0.5 volts below the DUT voltage.

Alternatively, a net current supply of Ist2

Ist2=[Is 550+Is 555]–Is 426 enters node N512. During input testing on output Vd 430 switch S426 is also open, thus Ist2 is supplied by buffer 520. For one embodiment, buffer 520 is a unity buffer and diodes D50–D55 are forward biased during a 0.5 voltage drop Thus, N561 is equal to the DUT voltage, N551 is one volt above the DUT voltage, and N512 is clamped at 0.5 volts above the DUT voltage. Accordingly, LR 500 ensures that nodes N411 and N412 track the voltage on the DUT pin while switches S421 and S426 are in the open position. Thus, the switching of S421 and S426 does not transfer any parasitic capacitance because D42 and D44 are kept off (i.e. reverse biased) while switches S421 and S426 are in the open position. LR 500 also stops nodes 411 and N412 from floating, thus reducing the leakage current on output Vd 430.

Figure 6:
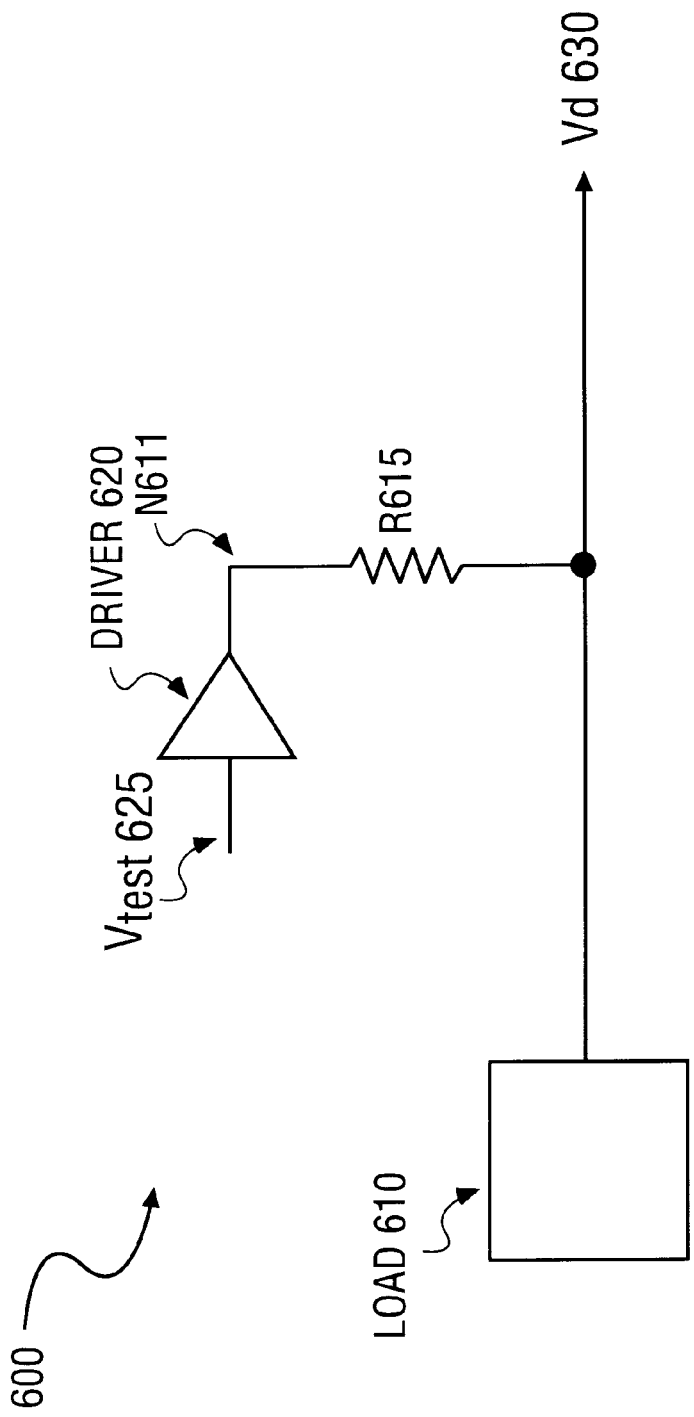
FIG. 6 shows one embodiment of a low voltage driver using the load regulator of FIG. 5.

For one embodiment, LR 500 is used as a low voltage driver. FIG. 6 illustrates a low voltage driver used to drive wave forms on a DUT input coupled to output Vd 630. System 600 includes input Vtest 655 coupled to driver 620 which, in turn, is coupled to a resistor (R615). R615 is also coupled to load 610 (corresponding to system 400) and output VD 630. For one embodiment, driver 620 is a unity buffer that transfers the value on input Vtest 655 to node N611. System 600 creates voltage swings on output Vd 630 by opening switches 570 and 575. System 600 also creates voltage swings on output Vd 630 by controlling the values of input Vtest 625, R215, Vs 410, and the transitioning frequency of switches S421 and S426.

If switch S426 is in the open position then the voltage on Vd 430 is

Vd 430=Vtest 625–[Is 550–Is 426][R615]

If switch S426 is in the closed position, however, then the voltage on Vd 430 is Vd 430=Vtest 625–[Is 550–Is 426–Is 425][R615]

LR 500 provides finer control over the voltage swing on output Vd 430 by introducing Is 426 in the derivation of the voltage driven on output Vd 430. LR 500 also ensures that nodes N411 and N412 are clamped while switches S421 and S426 are in the open position. Thus, the switching of S421 and S426 does not transfer any parasitic capacitance because D44 is kept off (i.e. reverse biased). This results in system 600 producing a low voltage wave forms with consistent timing characteristics.

For one embodiment, a 50 mV to negative 50 m output swing is generated on output Vd 630. Accordingly, the current sources of system 400, Vtest 625, and R615 have predefined values. Specifically, Is 420 equals 2 mA, Is 421 equals 1 mA, Is 425 equals 2 mA, Is 426 equals 1 mA, Is 555 equals 1 Ma, Is 565 equals 1 mA, Is 550 equals 500 uA, and Is 560 equals 500 ua. Additionally, Vtest 625 equals 75 mV and R 615 equals 50 ohms.

In the foregoing specification, the invention has been described with reference to specific exemplary embodiments thereof. It will, however, be evident that various modifications and changes may be made thereof without departing from the broader spirit and scope of the invention as set forth in the appended claims. The specification and drawings are, accordingly, to be regarded in an illustrative rather than a restrictive sense.

What is claimed is:

1. A programmable load circuit operable to generate a plurality of test signals, the programmable load circuit comprising:

a diode bridge coupled between an input and an output, the diode bridge comparing the voltage on the input to a voltage on the output;

a plurality of current sources, wherein a first set of the plurality of current sources are coupled to intermediate nodes of the diode bridge;

a switching circuit coupled between the intermediate nodes of the diode bridge and a second set of the plurality of current sources; and a load regulator input coupled to the output and first and second load regulator nodes coupled to the intermediate nodes of the diode bridge, wherein the load regulator is configured to reduce leakage current on the output;

a buffer coupled to the input;

a semi-diode bridge coupled between the load regulator input, and the first and second load regulator nodes; and another plurality of current sources coupled to intermediate nodes of the semi-diode bridge.

2. The programmable load circuit of claim 1, wherein the switching circuit is configured to selectively couple the second set of the plurality of current sources to the intermediate nodes of the diode bridge.

3. The programmable load circuit of claim 1, wherein the load regulator is further configured to adjust voltages on the intermediate nodes of the diode bridge, the adjustment operable to have the intermediate nodes track the voltage level on the output.

4. The programmable load circuit of claim 2, wherein the programmable load comprises a first input coupled to the output, a second input coupled to a first intermediate node of the diode bridge, and a third input coupled to a second intermediate node of the diode bridge.

5. An apparatus, comprising:

a) a diode bridge having four nodes, a first of said nodes is an input node, a second of said nodes is an output node, said first and second nodes opposite one another in said diode bridge, a third and fourth of said nodes opposite one another in said diode bridge;

b) a first and second current source coupled to said third node, a first switch between said third node and said second current source;

c) third and a fourth current source coupled to said fourth node, a second switch between said fourth node and said fourth current source;

d) a plurality of diodes in series;

e) a buffer coupled between said output node and a node within said plurality of diodes in series;

f) a first diode coupled between said plurality of diodes in series and said fourth node;

g) a fifth and sixth current source coupled to said first diode and said plurality of diodes in series, a third switch between said sixth current source and said first diode and said plurality of diodes in series;

h) a second diode coupled between said plurality of diodes in series and said third node; and i) a seventh and eighth current source coupled to said second diode and said plurality of diodes in series, a fourth switch between said eighth current source and said second diode and said plurality of diodes in series.

6. The apparatus of claim 5 wherein said diode bridge is located upon an interface circuit that determines the input/output (I/O) characteristics of a device under test (DUT).

7. The apparatus of claim 6 wherein said interface circuit is located on a testing base that orients and couples said DUT to said interface circuit.

8. The apparatus of claim 6 wherein said interface circuit is coupled to a diagnostic system that applies test vectors to said DUT via said interface circuit.

9. The apparatus of claim 8 wherein said diagnostic system is coupled to a computer.

10. The apparatus of claim 6 wherein said output is coupled to a pin on a DUT.

11. The apparatus of claim 10 wherein said pin is an input pin of said DUT.

12. The apparatus of claim 11 wherein said first and second switches are open and said third and fourth switches are closed.

13. The apparatus of claim 10 wherein said pin in an output pin of said DUT.

14. The apparatus of claim 13 wherein said first and second switches are closed.

15. The apparatus of claim 13 wherein a voltage at said input is at the switch point voltage at said DUT output pin.

16. The apparatus of claim 5 wherein at least two diodes within said diode bridge are matched in size and physical layout.

17. The apparatus of claim 5 wherein said diodes within said bridge circuit are Schottky diodes.

18. The apparatus of claim 5 wherein a diode within said plurality of diodes is a Schottky diode.

19. The apparatus of claim 5 wherein said buffer is a unity gain buffer.

20. The apparatus of claim 5 wherein said plurality of diodes further comprises four diodes.

21. The apparatus of claim 20 wherein said node within said plurality of diodes is the node between a second diode and a third diode within said plurality of diodes.

22. The apparatus of claim 5 further comprising a resistor between a driver and said output node.

* * * * *